(12) United States Patent
Sun et al.

(10) Patent No.: US 8,433,025 B2
(45) Date of Patent: Apr. 30, 2013

(54) DIGITAL PHASE-LOCKED LOOP WITH GATED TIME-TO-DIGITAL CONVERTER

(75) Inventors: Bo Sun, Carlsbad, CA (US); Gurkanwal Singh Sahota, San Diego, CA (US); Zixiang Yang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1239 days.

(21) Appl. No.: 11/969,359

(22) Filed: Jan. 4, 2008

(65) Prior Publication Data
US 2009/0175399 A1  Jul. 9, 2009

(51) Int. Cl.
*H03D 3/24* (2006.01)
(52) U.S. Cl.
USPC ........... 375/376; 375/327; 375/373; 327/156; 455/260
(58) Field of Classification Search ........... 375/376, 375/373, 327; 327/156; 455/260
See application file for complete search history.

(56) References Cited

U.S. PATENT DOCUMENTS

| | | | |
|---|---|---|---|
| 6,593,773 B2 * | 7/2003 | Staszewski et al. | 326/46 |
| 7,019,570 B2 | 3/2006 | Starr | |
| 7,205,924 B2 * | 4/2007 | Vemulapalli et al. | 341/166 |
| 7,786,913 B2 * | 8/2010 | Waheed et al. | 341/143 |
| 2005/0186920 A1 | 8/2005 | Staszewski et al. | |
| 2006/0038710 A1 | 2/2006 | Staszewski et al. | |
| 2007/0085579 A1 | 4/2007 | Wallberg et al. | |
| 2007/0273569 A1 | 11/2007 | Lin | |

OTHER PUBLICATIONS

International Search Report and Written Opinion—PCT/US2008/088263, International Search Authority—European Patent Office—Apr. 23, 2009.
Dudek, et al., "A High-Resolution CMOS Time-to-Digital Converter Utilizing a Vernier Delay Line," IEEE Transactions on Solid-State Circuits, vol. 35, No. 2, pp. 240-247, Feb. 2000.
Taiwan Search Report—TW097151664—TIPO—Mar. 15, 2012.

* cited by examiner

*Primary Examiner* — Ted Wang
(74) *Attorney, Agent, or Firm* — S. Hossain Beladi

(57) ABSTRACT

A digital PLL (DPLL) includes a time-to-digital converter (TDC) and a control unit. The TDC is periodically enabled for a short duration to quantize phase information and disabled for the remaining time to reduce power consumption. The TDC receives a first clock signal and a first reference signal and provides a TDC output indicative of the phase difference between the first clock signal and the first reference signal. The control unit generates an enable signal based on a main reference signal and enables and disables the TDC with the enable signal. In one design, the control unit delays the main reference signal to obtain the first reference signal and a second reference signal, generates the enable signal based on the main reference signal and the second reference signal, and gates a main clock signal with the enable signal to obtain the first clock signal for the TDC.

22 Claims, 9 Drawing Sheets

DIGITAL PHASE-LOCKED LOOP WITH GATED TIME-TO-DIGITAL CONVERTER

BACKGROUND

I. Field

The present disclosure relates generally to electronics, and more specifically to a digital phase-locked loop.

II. Background

Phase-locked loops (PLLs) are an integral part of many electronics circuits and are particularly important in communication circuits. For example, digital circuits use clocks to trigger synchronous circuits, e.g., flip-flops. Transmitters and receivers use local oscillator (LO) signals for frequency upconversion and downconversion, respectively. Wireless devices (e.g., cellular phones) for wireless communication systems typically use clocks for digital circuits and LO signals for transmitters and receivers. The clocks and LO signals are generated with oscillators and their frequencies are often controlled with PLLs.

A PLL typically includes various circuit blocks used to adjust the frequency and/or phase of an oscillator signal from an oscillator. These circuit blocks may consume a relatively large amount of power, which may be undesirable for a portable device such as a cellular phone. There is therefore a need in the art for techniques to reduce power consumption of a PLL without impacting performance.

SUMMARY

A digital PLL (DPLL) having good performance and lower power consumption is described herein. A DPLL is a PLL implemented with digital circuits instead of analog circuits. The digital implementation may provide certain advantages such as lower cost, less circuit area, etc.

In one design, the DPLL utilizes a time-to-digital converter (TDC) that is dynamically enabled and disabled to reduce power consumption without impacting operation. The TDC is periodically enabled for a short period of time to quantize phase information of an oscillator and is disabled for the remaining time to reduce power consumption.

In one design, the DPLL includes the TDC and a control unit. The TDC receives a first clock signal and a first reference signal and provides a TDC output indicative of the phase difference between the first clock signal and the first reference signal. The control unit generates an enable signal based on (e.g., based solely on) a main reference signal and enables and disables the TDC with the enable signal.

In one design, the control unit delays the main reference signal by a first duration to obtain the first reference signal and further delays the first reference signal by a second duration to obtain a second reference signal. The control unit generates the enable signal based on the main reference signal and the second reference signal. The control unit then gates a main clock signal with the enable signal to obtain the first clock signal. The first and/or second duration may be programmable and may be selected based on the frequency of the main clock signal. The enable signal is active for the first and second durations. The first clock signal has at least one clock cycle around each leading edge of the first reference signal and is gated off for the remaining time.

Various aspects and features of the disclosure are described in further detail below.

DETAILED DESCRIPTION

Figure 1:
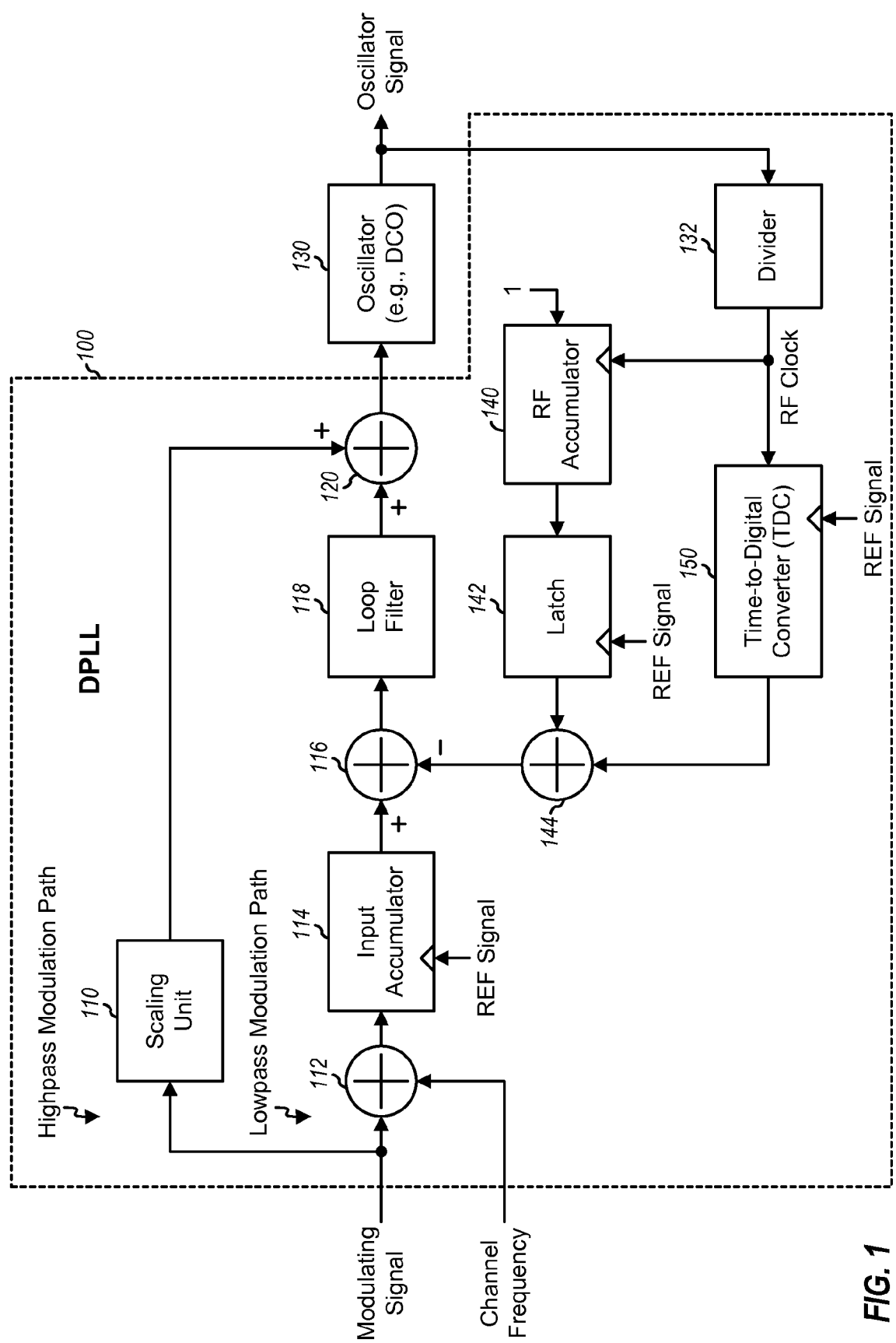
FIG. 1 shows a block diagram of a DPLL.

FIG. 1 shows a block diagram of a design of a DPLL 100. In this design, DPLL 100 implements two-point or dual-port modulation in order to achieve wideband modulation. Within DPLL 100, a modulating signal is provided to both a lowpass modulation path and a highpass modulation path. In the highpass modulation path, a scaling unit 110 receives and scales the modulating signal with a gain and provides a scaled modulating signal. In the lowpass modulation path, a summer 112 receives and sums the modulating signal with a static value for a center frequency of a frequency channel used for communication. An input accumulator 114 accumulates the output of summer 112 and provides an input phase. The accumulation essentially converts frequency to phase. Input accumulator 114 is triggered by a reference (REF) signal, which may have a fixed frequency of $f_{ref}$. Various circuit blocks and signals within DPLL 100 are updated with the REF signal, and t is an index for the REF signal.

A summer 116 receives and subtracts a feedback phase from the input phase and provides a phase error. A loop filter 118 filters the phase error and provides a filtered phase error. Loop filter 118 sets the loop dynamics of DPLL 100. A summer 120 sums the filtered phase error from loop filter 118 and the scaled modulating signal from scaling unit 110 and provides a control signal for an oscillator 130. The control signal adjusts the frequency of oscillator 130 such that the phase of the oscillator follows the phase of the modulation. The control signal may have any number of bits of resolution, e.g., 8, 12, 16, 20, 24, or more bits of resolution.

The bandwidth of the modulating signal may be determined by the application for which DPLL 100 is used and may be wider than the closed-loop bandwidth of the DPLL. The bandwidth of the lowpass modulation path is determined by loop filter 118 and may be relatively narrow (e.g., less than 100 KHz) in order to achieve the desired noise filtering and loop dynamics. By applying the modulating signal via separate highpass and lowpass modulation paths, DPLL 100 can modulate oscillator 130 with a wider signal bandwidth than the closed-loop bandwidth of the DPLL. The gain of scaling unit 110 may be determined as described in U.S. Pat. No. 6,909,331, entitled "PHASE LOCKED LOOP HAVING A FORWARD GAIN ADAPTATION MODULE," issued Jun. 21, 2005.

Oscillator 130 may be a digitally controlled oscillator (DCO), a voltage controlled oscillator (VCO), a current controlled oscillator (ICO), or some other type of oscillator whose frequency can be adjusted by a control signal. Oscillator 130 may operate at a nominal frequency of $f_{osc}$, which may be determined by the application for which DPLL 100 is used. For example, DPLL 100 may be used for a wireless communication device, and $f_{osc}$ may be hundreds of megahertz (MHz) or few gigahertz (GHz). The REF signal may be generated based on a crystal oscillator (XO), a voltage controlled crystal oscillator (VCXO), a temperature compensated crystal oscillator (TCXO), or some other type of oscillator having an accurate frequency. The frequency of the REF signal may be much lower than the frequency of the oscillator signal. For example, $f_{ref}$ may be tens of MHz whereas $f_{osc}$ may be several GHz.

In the feedback path of DPLL 100, a divider 132 receives the oscillator signal from oscillator 130, divides the oscillator signal in frequency by an integer factor (e.g., 1, 2, 3, 4, etc.), and provides a radio frequency (RF) clock. An RF accumulator 140 increments by one for each RF clock cycle. A latch 142 latches the output of RF accumulator 140 when triggered by the REF signal and provides a coarse output phase. A TDC 150 receives the RF clock and the REF signal, determines the phase of the RF clock when triggered by the REF signal, and provides a TDC output that indicates the fine phase difference between the RF clock and the REF signal. TDC 150 quantizes the phase information of oscillator 130 beyond the resolution of the REF signal and implements a fractional phase sensor for DPLL 100. A summer 144 sums the coarse output phase from latch 142 and the TDC output and provides the feedback phase, which is an estimate of the phase of oscillator 130.

The amount of power consumed by a digital circuit is typically related to the frequency of the clock used to trigger the digital circuit. Most of the circuit blocks in DPLL 100 may operate based on the REF signal, which may have a relatively low frequency. RF accumulator 140 and TDC 150 operate based on the RF clock, which may be many times higher in frequency than the REF signal. Consequently, RF accumulator 140 and TDC 150 may be responsible for a large fraction (e.g., around 50%) of the total power consumption of DPLL 100. Divider 132 divides down the oscillator signal and provides the RF clock at a lower frequency, which may reduce power consumption by RF accumulator 140 and TDC 150. Further power reduction may be achieved by disabling RF accumulator 140 after DPLL 100 has locked. With RF accumulator 140 disabled, the phase error may be determined based on the fine output phase from TDC 150 and the fine portion of the input phase from input accumulator 114, as described in commonly assigned U.S. patent application Ser. No. 11/947,587, entitled "DIGITAL PHASE-LOCKED LOOP OPERATING BASED ON FRACTIONAL INPUT AND OUTPUT PHASES," filed Nov. 29, 2007. Further power reduction may be achieved by dynamically gating TDC 150 on and off as described below.

Figure 2:
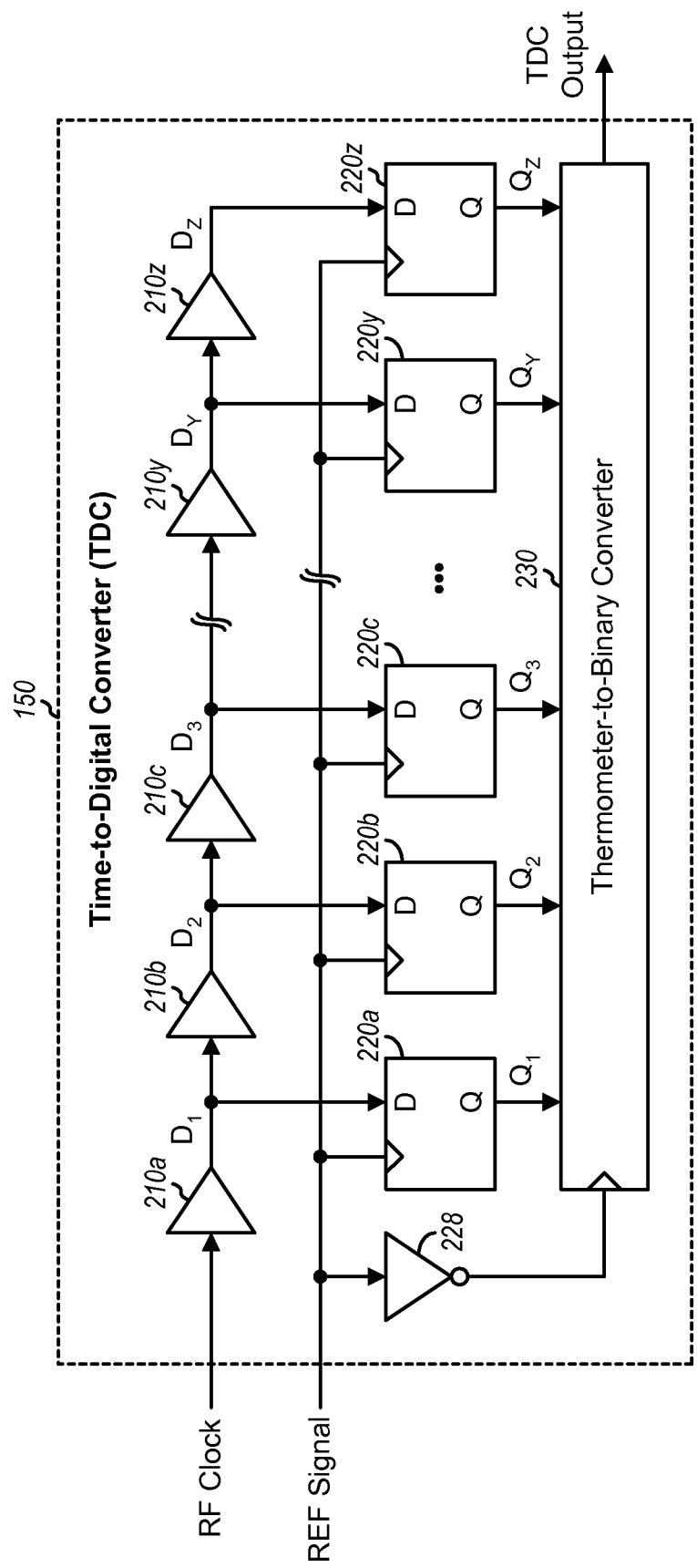
FIG. 2 shows a schematic diagram of a TDC.

FIG. 2 shows a schematic diagram of a design of TDC 150 in FIG. 1. TDC 150 compares the phase of the RF clock against the phase of the REF signal and provides the detected phase difference with multiple (B) bits of resolution.

TDC 150 includes $Z=2^B$ delay elements 210a through 210z, Z D flip-flops 220a through 220z, and a thermometer-to-binary converter 230. Delay elements 210a through 210z are coupled in series, with delay element 210a receiving the RF clock. Each delay element 210 may be implemented with inverters and/or other types of logic elements to obtain the desired delay resolution. Delay elements 210a through 210z may provide a total delay of approximately one RF clock cycle. For example, if the RF clock frequency is 2 GHz, then one RF clock cycle is 500 picoseconds (ps), and each delay element 210 may provide a delay of approximately 500/Z ps.

D flip-flops 220a through 220z have their D inputs coupled to the outputs of delay elements 210a through 210z, respectively, and their clock inputs receiving the REF signal. Each D flip-flop 220 samples the output of an associated delay element 210 and provides the sampled output to converter 230. The number of D flip-flops at logic high versus the number of D flip-flops at logic low is indicative of the phase difference between the RF clock and the REF signal. This phase difference may have a resolution of 1/Z RF clock cycle. An inverter 228 receives the REF signal and provides an inverted REF signal to converter 230. Converter 230 receives the Z outputs from D flip-flops 220a through 220z, converts these Z outputs to a B-bit binary value when triggered by the inverted REF signal, and provides the B-bit binary value as the TDC output.

In general, TDC 150 may be designed with any number of bits of resolution. For example, B may be 8 or more depending on the desired delay resolution, the minimum delay available with a given integrated circuit (IC) process, etc. The desired delay resolution may be dependent on the application for which DPLL 100 is used, the RF clock frequency, etc.

Figure 3:
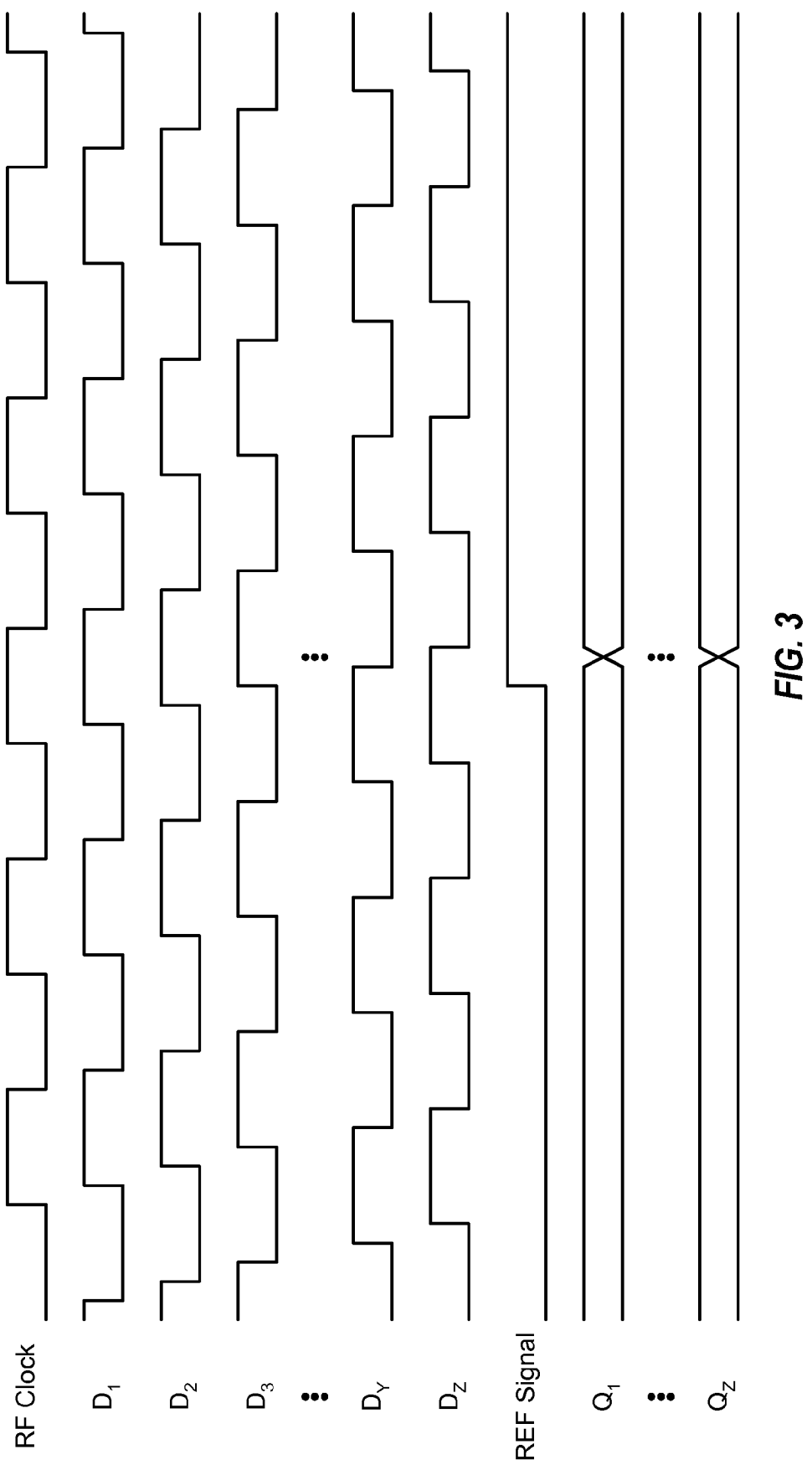
FIG. 3 shows a timing diagram of signals within the TDC.

FIG. 3 shows a timing diagram of various signals within TDC 150 in FIG. 2. The RF clock is shown at the top of FIG. 3. The Z delayed signals $D_1$ through $D_Z$ from delay elements 210a through 210z, respectively, are shown below the RF clock. The $D_1$ through $D_Z$ signals are delayed by progressively larger amounts through progressively more delay elements. The $D_1$ through $D_Z$ signals may be latched with the leading/rising edge of the REF signal, which may occur at any time relative to the leading edges of these delayed signals. The Z latched signals $Q_1$ through $Q_Z$ from D flip-flops 220a through 220z, respectively, are provided to converter 230.

As noted above, the RF clock frequency may be many times higher than the REF signal frequency. For example, the RF clock may be at 2 GHz, the REF signal may be at 57 MHz, and approximately 35 RF clock cycles may be present in each REF signal cycle. The Z delay elements 210a through 210z operate at the RF clock and their outputs may transition in each RF clock cycle. Furthermore, there may be many delay elements 210 coupled in series to obtain fine phase resolution. Delay elements 210 may thus consume a large amount of power due to both their high operating frequency and the large number of delay elements.

In an aspect, lower power consumption may be achieved for TDC 150 by dynamically enabling the TDC for small amounts of time to capture phase information and disabling the TDC for the remaining time. This may be achieved by gating off the RF clock except during a small window around each leading edge of the REF signal. As shown in FIG. 3, the outputs of the Z delay elements 210a through 210z are captured only once every REF signal cycle. The REF signal may be used to generate the small window around each leading edge. TDC 150 may be enabled during this small window to obtain phase information and may be disabled outside of the window to conserve power.

Figure 4:
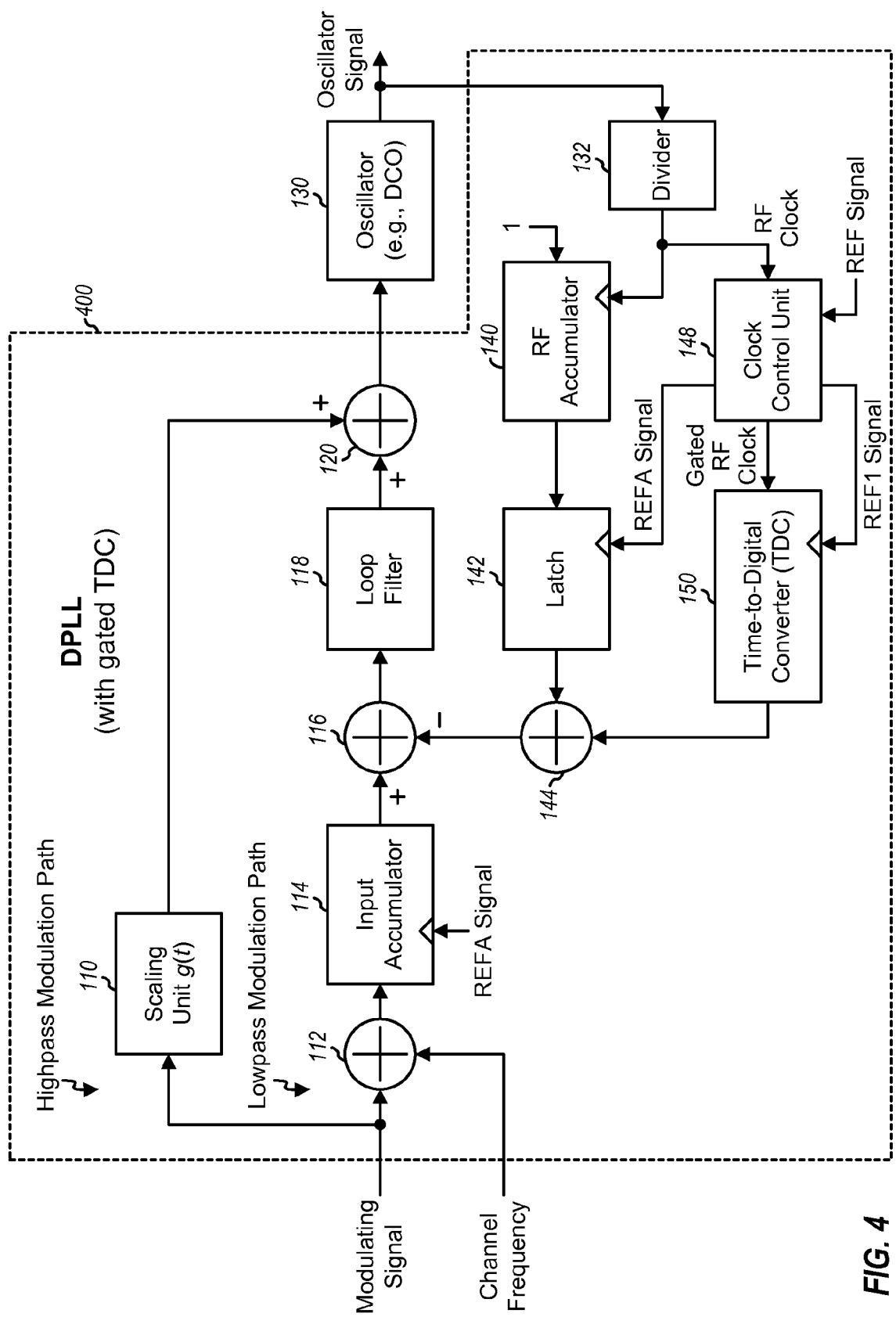
FIG. 4 shows a block diagram of a DPLL with a gated TDC.

FIG. 4 shows a block diagram of a design of a DPLL 400 with a gated TDC. In this design, DPLL 400 includes all circuit blocks within DPLL 100 in FIG. 1. DPLL 400 further includes a clock control unit 148 that receives the RF clock from divider 132 and the REF signal. Control unit 148 generates a gated RF clock that is enabled for only a fraction of the time around the leading edges of the REF signal. Control unit 148 also generates a first reference (REF1) signal for TDC 150 and another reference (REFA) signal for input accumulator 114, latch 142, and other blocks within DPLL 400.

Figure 5:
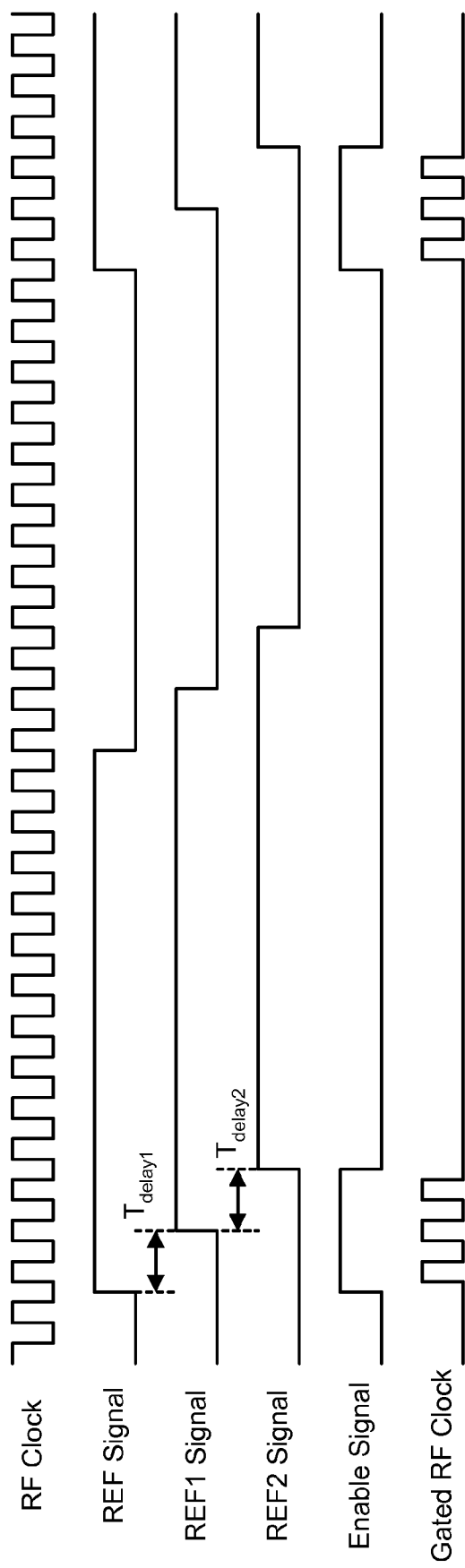
FIG. 5 shows a timing diagram of signals within a clock control unit.

FIG. 5 shows a timing diagram of various signals within clock control unit 148 in FIG. 4. The RF clock is shown at the top of FIG. 5, and the REF signal is shown below the RF clock. The REF1 signal is obtained by delaying the REF signal by a duration of $T_{delay1}$. A second reference (REF2) signal is obtained by delaying the REF1 signal by a duration of $T_{delay2}$. An Enable signal is generated based on the REF signal and the REF2 signal. The Enable signal is at logic high from the leading edge of the REF signal to the leading edge of the REF2 signal, and is at logic low for the remaining time. The RF clock is gated with the Enable signal to generate a gated RF clock, which may include one or more cycles of the RF clock. The leading edge of the REF signal is used to turn on the RF clock gating. The leading edge of the REF2 signal is used to turn off the RF clock gating. The leading edge of the REF1 signal is used to trigger and enable the core circuits within TDC 150.

Referring back to FIG. 2, the gated RF clock (instead of the RF clock) may be provided to delay element 210*a*. The REF1 signal (instead of the REF signal) may be provided to the clock inputs of D flip-flops 220*a* through 220*z* and to inverter 228.

Figure 6:
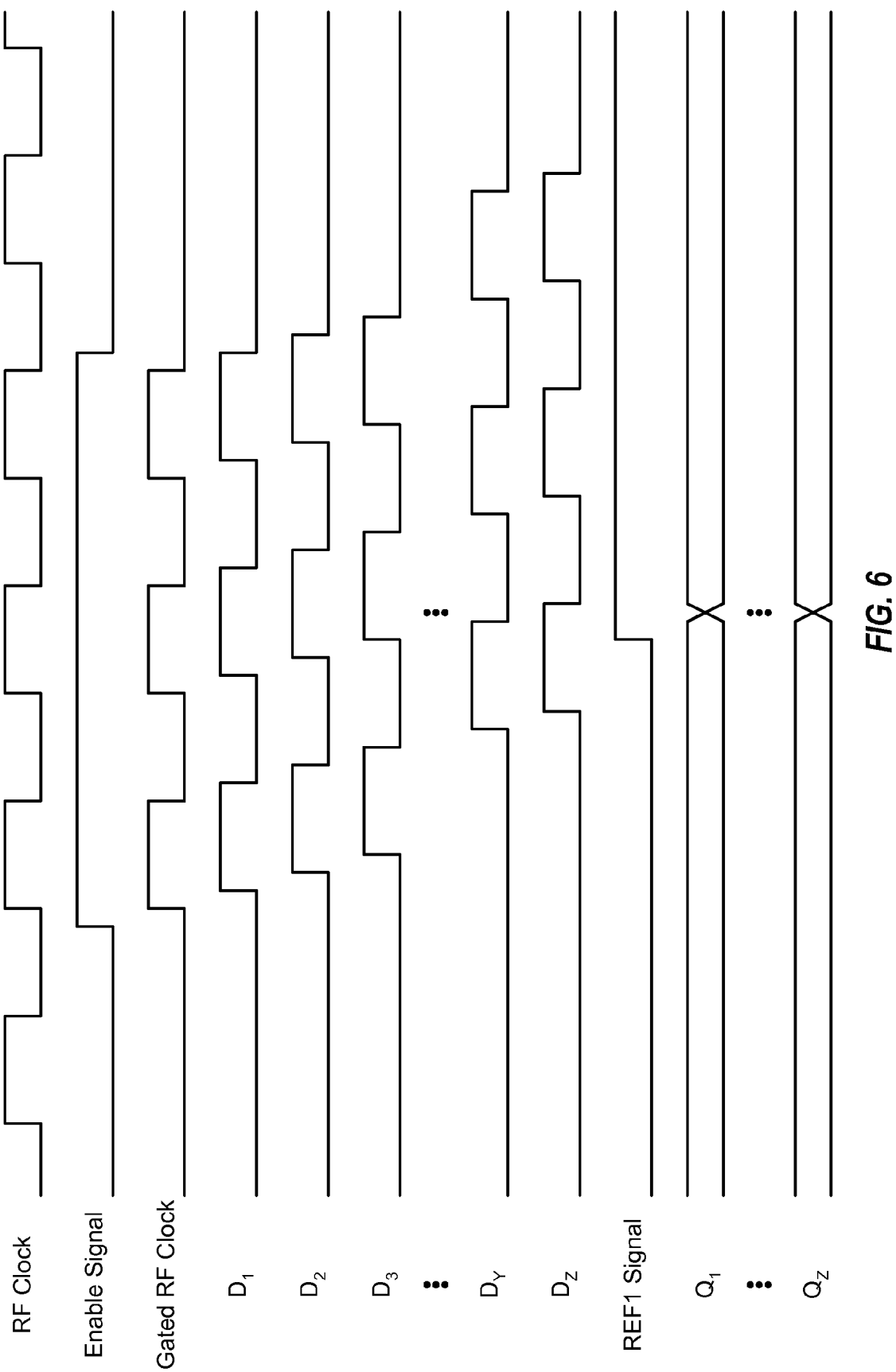
FIG. 6 shows a timing diagram of signals within the gated TDC.

FIG. 6 shows a timing diagram of various signals within TDC 150 in FIG. 2 with the gated RF clock. The RF clock and the Enable signal are shown at the top of FIG. 6 for reference. The gated RF clock is shown below the Enable signal. The Z delayed signals $D_1$ through $D_Z$ from delay elements 210*a* through 210*z*, respectively, are shown below the gated RF clock. The $D_1$ through $D_Z$ signals are latched by the leading edge of the REF1 signal, which occurs during the active window on the Enable signal. The Z latched signals $Q_1$ through $Q_Z$ from D flip-flops 220*a* through 220*z*, respectively, are provided to converter 230.

As shown in FIG. 6, the functionality of TDC 150 is not affected by gating on/off the RF clock because the phase information of oscillator 130 is only needed for a short period of time. The gated RF clock and the $D_1$ through $D_Z$ signals are valid for a duration of time around each leading edge of the REF1 signal. In general, the gated RF clock may be valid for any number of RF clock cycles prior to the leading edge of the REF1 signal and for any number of RF clock cycles after the leading edge. However, it may be desirable to minimize the number of clock cycles in the gated RF clock in order to reduce power consumption. The Enable signal may be generated to pass only one or two RF clock cycles. In one design, the Enable signal may pass approximately one RF clock cycle prior to the leading edge and approximately one RF clock cycle after the leading edge of the REF1 signal. By dynamically controlling TDC 150 and enabling the TDC only when necessary, a large portion (e.g., 90%) of the power may be saved for TDC 150.

Figure 7:
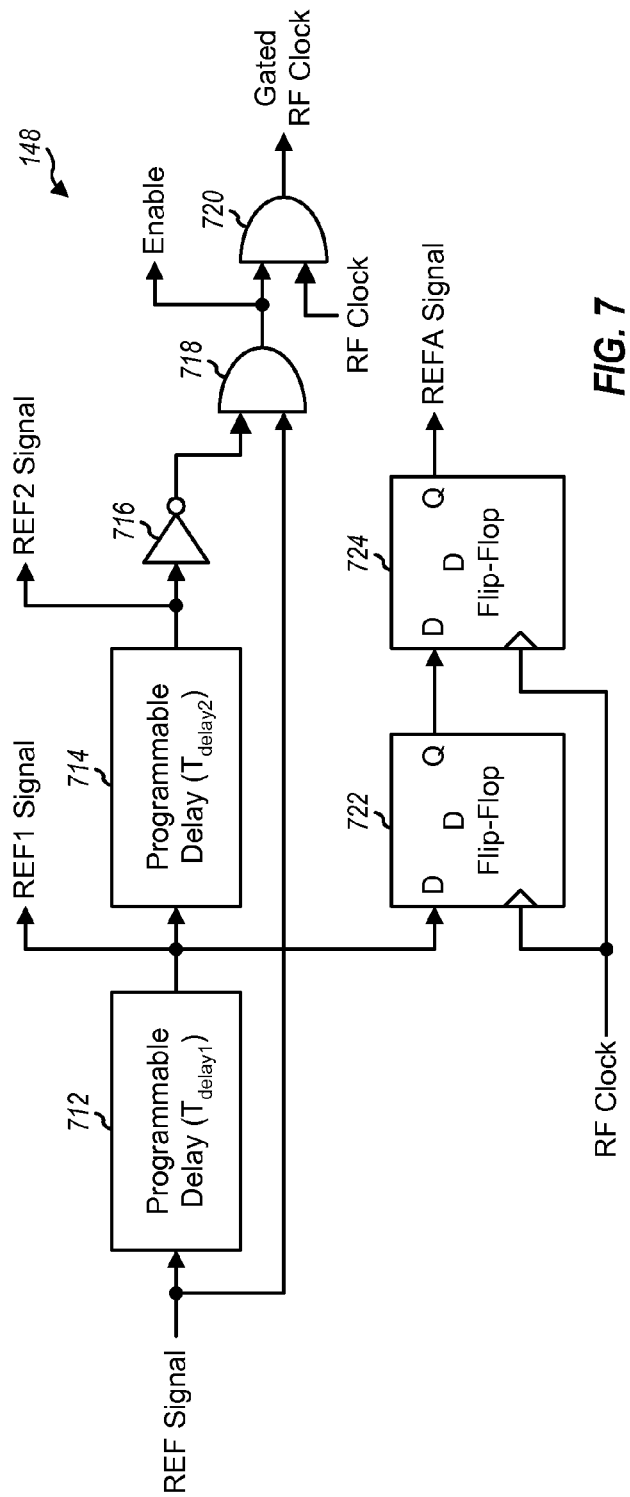
FIG. 7 shows a block diagram of the clock control unit.

FIG. 7 shows a schematic diagram of a design of clock control unit 148 in FIG. 4. Within control unit 148, a programmable delay unit 712 receives and delays the REF signal by $T_{delay1}$ and provides the REF1 signal. A programmable delay unit 714 receives and delays the REF1 signal by $T_{delay2}$ and provides the REF2 signal. The duration of the active window on the Enable signal as well as the position of the leading edge of the REF1 signal relative to this window is determined by $T_{delay1}$ and $T_{delay2}$, which may be fixed or configurable delays. An inverter 716 inverts the REF2 signal and provides an inverted REF2 signal. An AND gate 718 receives the inverted REF2 signal and the REF signal and provides the Enable signal. An AND gate 720 receives the Enable signal and the RF clock and provides the gated RF clock. AND gate 720 is a gating circuit that switches on and off the RF clock.

D flip-flops 722 and 724 are coupled in series. D flip-flop 722 receives the REF1 signal at its D input and the RF clock at its clock input. D flip-flop 724 receives the Q output of D flip-flop 722 at its D input and the RF clock at its clock input and provides the REFA signal. D flip-flops 722 and 724 reclock the REF1 signal so that the REFA signal is time aligned with the RF clock.

Figure 8:
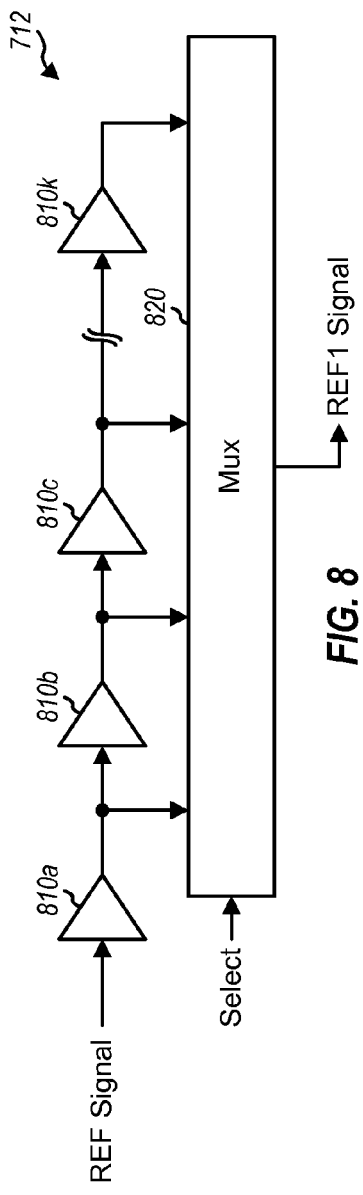
FIG. 8 shows a schematic diagram of a programmable delay unit.

FIG. 8 shows a schematic diagram of a design of programmable delay unit 712, which may also be used for programmable delay unit 714. In this design, programmable delay unit 712 includes K delay elements 810*a* through 810*k* coupled in series. Delay element 810*a* receives the REF signal. A multiplexer (Mux) 820 receives the outputs of delay elements 810*a* through 810*k* and provides the output of one delay element 810 as the REF1 signal. A Select signal may select the proper number of delay elements 810 to obtain the desired amount of delay. The number of delay elements 810 to select may be based on various factors such as the frequency of the RF clock, the amount of delay provided by each delay element, etc.

In one design, the amount of delay $T_{delay1}$ by programmable delay unit 712 and/or the amount of delay $T_{delay2}$ by programmable delay unit 714 may be varied based on the RF clock frequency. For example, oscillator 130 may operate between 1.5 GHz and 4 GHz, and $T_{delay1}$ and/or $T_{delay2}$ may be inversely proportional to the RF clock frequency.

FIGS. 4 and 7 show a design in which TDC 150 is enabled and disabled by gating on and off the RF clock. TDC 150 may also be enabled and disabled in other manners to reduce power consumption.

Figure 9:
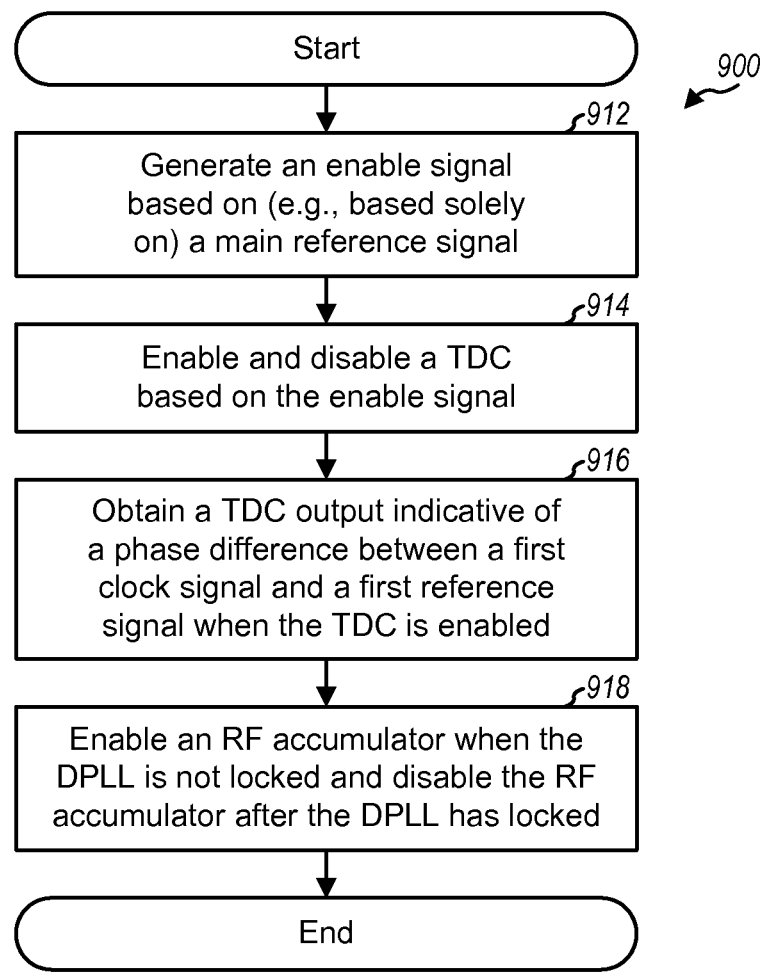
FIG. 9 shows a process for operating the DPLL with gated TDC.

FIG. 9 shows a design of a process 900 for operating a DPLL with a gated TDC. An enable signal may be generated based on (e.g., based solely on) a main reference signal (e.g., the REF signal) (block 912). In one design of block 912, the main reference signal may be delayed by a first duration to obtain a first reference signal (e.g., the REF1 signal), and the first reference signal may be delayed by a second duration to obtain a second reference signal (e.g., the REF2 signal). The first and/or second duration may be programmable and may be selected based on the frequency of a main clock signal (e.g., the RF clock). The enabled signal may be generated based on the main reference signal and the second reference signal (e.g., as shown in FIG. 7) and may be active for the first and second durations. The main clock signal may be directly from an oscillator or may be obtained by dividing the output of the oscillator in frequency.

A TDC may be enabled and disabled based on the enable signal (block 914). In one design of block 914, the main clock signal may be gated with the enable signal to obtain a first clock signal (e.g., the gated RF clock). The main clock signal may be continuous. The first clock signal may have at least one clock cycle around each leading edge of the first reference signal and may be gated off for the remaining time. The TDC may be enabled and disabled based on the gated first clock signal. The TDC may also be enabled and disabled in other manners. A TDC output indicative of a phase difference between the first clock signal and the first reference signal may be obtained when the TDC is enabled (block 916). An RF accumulator may be enabled when the DPLL is not locked and disabled after the DPLL has locked (block 918).

The DPLL with gated TDC described herein may be used for various applications such as communication, computing, networking, personal electronics, etc. For example, the DPLL may be used for wireless communication devices, cellular phones, personal digital assistants (PDAs), handheld devices, gaming devices, computing devices, laptop computers, consumer electronics devices, personal computers, cordless phones, etc. An example use of the DPLL in a wireless communication device is described below.

Figure 10:
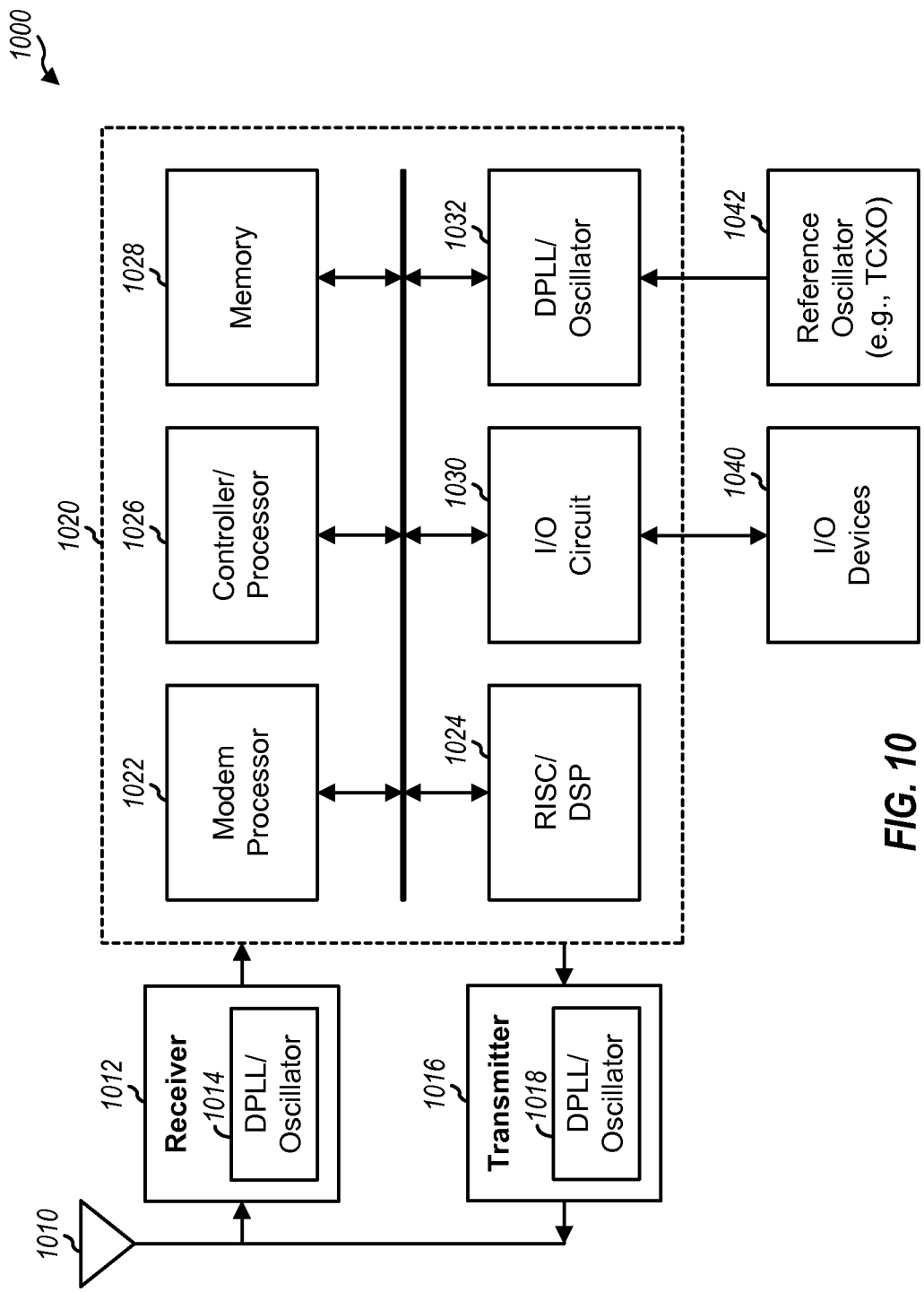
FIG. 10 shows a block diagram of a wireless communication device.

FIG. 10 shows a block diagram of a design of a wireless communication device 1000 for a wireless communication system. Wireless device 1000 may be a cellular phone, a terminal, a handset, a wireless modem, etc. The wireless communication system may be a Code Division Multiple Access (CDMA) system, a Global System for Mobile Communications (GSM) system, etc.

Wireless device 1000 is capable of providing bi-directional communication via a receive path and a transmit path. On the receive path, signals transmitted by base stations (not shown) are received by an antenna 1010 and provided to a receiver 1012. Receiver 1012 conditions and digitizes the received signal and provides samples to a section 1020 for further processing. On the transmit path, a transmitter 1016 receives data to be transmitted from section 1020, processes and conditions the data, and generates a modulated signal, which is transmitted via antenna 1010 to the base stations. Receiver 1012 and transmitter 1016 may support CDMA, GSM, etc.

Section 1020 includes various processing, interface and memory units such as, for example, a modem processor 1022, a reduced instruction set computer/digital signal processor (RISC/DSP) 1024, a controller/processor 1026, a memory 1028, an input/output (I/O) circuit 1030, and a DPLL/oscillator 1032. Modem processor 1022 may perform processing for data transmission and reception, e.g., encoding, modulation, demodulation, decoding, etc. RISC/DSP 1024 may perform general and specialized processing for wireless device 1000. Controller/processor 1026 may direct the operation of various units within section 1020. Memory 1028 may store data and/or instructions for various units within section 1020. I/O circuit 1030 may communicate with external I/O devices 1040.

DPLL/oscillator 1032 may generate clocks for the processing units within section 1020 and may also generate the REF signal. A DPLL/oscillator 1014 may generate a receive LO signal used by receiver 1012 for frequency downconversion and/or demodulation. A DPLL/oscillator 1018 may generate a transmit LO signal used by transmitter 1016 for frequency upconversion and/or modulation. DPLL/oscillator 1014, 1018 and/or 1032 may be implemented with DPLL 400 and oscillator 130 in FIG. 4. A reference oscillator 1042 may generate an accurate clock signal for DPLL/oscillator 1032 and/or other DPLLs/oscillators. Reference oscillator 1042 may be an XO, a VCXO, a TCXO, etc.

The DPLL with gated TDC described herein may be used for frequency synthesis in receiver 1012 and/or transmitter 1016, which may operate over a wide range of frequencies. The DPLL may be used with a DCO to implement an all-digital phase-locked loop (ADPLL).

The DPLL with gated TDC described herein may be implemented on an IC, an analog IC, an RF IC (RFIC), a mixed-signal IC, an application specific integrated circuit (ASIC), a printed circuit board (PCB), an electronics device, etc. The DPLL may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc. The DPLL may be implemented with deep sub-micron RFCMOS transistors and may be able to achieve good performance and high level of integration.

An apparatus implementing the DPLL with gated TDC described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a time-to-digital converter (TDC) configured to receive a first clock signal and a first reference signal and to provide a TDC output indicative of a phase difference between the first clock signal and the first reference signal; and
   a control unit configured to generate an enable signal based on a main reference signal and to enable and disable the TDC based on the enable signal, wherein the control unit is configured to generate the enable signal based solely on the main reference signal.

2. The apparatus of claim 1, wherein the control unit is configured to gate a main clock signal with the enable signal to obtain the first clock signal, the main clock signal being continuous, and the first clock signal having at least one clock cycle around each leading edge of the first reference signal and being gated off for remaining time.

3. The apparatus of claim 2, further comprising:
   a divider configured to divide an oscillator signal in frequency and provide the main clock signal.

4. The apparatus of claim 1, wherein the TDC comprises:
   a plurality of delay elements coupled in series and configured to receive the first clock signal;
   a plurality of flip-flops coupled to the plurality of delay elements and configured to receive outputs of the plurality of delay elements at a data input and the first reference signal at a clock input; and
   a converter configured to receive outputs of the plurality of flip-flops and provide the TDC output.

5. An apparatus comprising:
   a time-to-digital converter (TDC) configured to receive a first clock signal and a first reference signal and to provide a TDC output indicative of a phase difference between the first clock signal and the first reference signal; and
   a control unit configured to generate an enable signal based on a main reference signal and to enable and disable the TDC based on the enable signal, wherein the control unit is configured to delay the main reference signal to obtain a second reference signal, and to generate the enable signal based on the main reference signal and the second reference signal.

6. The apparatus of claim 5, wherein the control unit is configured to delay the main reference signal by a programmable duration selected based on a frequency of the first clock signal to obtain the second reference signal, and wherein the enable signal is active for the programmable duration.

7. The apparatus of claim 5, wherein the control unit comprises:
   a first delay unit configured to delay the main reference signal by a first duration and provide the first reference signal; and
   a second delay unit configured to delay the first reference signal by a second duration and provide the second reference signal, and wherein the enable signal is active for the first and second durations.

8. An apparatus comprising:
a time-to-digital converter (TDC) configured to receive a first clock signal and a first reference signal and to provide a TDC output indicative of a phase difference between the first clock signal and the first reference signal;
a control unit configured to generate an enable signal based on a main reference signal and to enable and disable the TDC based on the enable signal; and
a radio frequency (RF) accumulator configured to receive a main clock signal and count number of cycles of the main clock signal, wherein the RF accumulator and the TDC are part of a digital phase-locked loop (DPLL), and wherein the RF accumulator is enabled when the DPLL is not locked and is disabled after the DPLL has locked.

9. An integrated circuit comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal, wherein the control unit is configured to generate the enable signal based solely on the main reference signal.

10. An integrated circuit comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal, wherein the control unit is configured to delay the main reference signal to obtain a second reference signal, and to generate the enable signal based on the main reference signal and the second reference signal.

11. The integrated circuit of claim 10, wherein the control unit is configured to delay the main reference signal by a programmable duration selected based on frequency of the first clock signal to obtain the second reference signal, and wherein the enable signal is active for the programmable duration.

12. The integrated circuit of claim 10, wherein the control unit comprises:
a first delay unit configured to delay the main reference signal by a first duration and provide the first reference signal; and
a second delay unit configured to delay the first reference signal by a second duration and provide the second reference signal, and wherein the enable signal is active for the first and second durations.

13. An integrated circuit comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal, wherein the control unit is configured to gate a main clock signal with the enable signal to obtain the first clock signal, the main clock signal being continuous, and the first clock signal having at least one clock cycle around each leading edge of the first reference signal and being gated off for remaining time.

14. A wireless device comprising:
a digital phase-locked loop (DPLL) comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal, wherein the control unit is configured to generate the enable signal based solely on the main reference signal.

15. A wireless device comprising:
a digital phase-locked loop (DPLL) comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal; and
a radio frequency (RE) accumulator configured to receive a main clock signal and count number of cycles of the main clock signal, the RF accumulator being enabled when the DPLL is not locked and being disabled after the DPLL has locked.

16. A wireless device comprising:
a digital phase-locked loop (DPLL) comprising:
a time-to-digital converter (TDC) configured to receive a first clock signal and a first reference signal and to provide a TDC output indicative of a phase difference between the first clock signal and the first reference signal; and
a control unit configured to generate an enable signal based on a main reference signal and to enable and disable the TDC based on the enable signal;
a first modulation path configured to process a modulating signal and provide an input phase signal; and
a second modulation path configured to process the modulating signal and provide a scaled modulating signal, and wherein the input phase signal is applied prior to a loop filter and the scaled modulating signal is applied after the loop filter.

17. A method implemented in a wireless device, the method comprising:
receiving a first clock signal and a first reference signal at a time-to-digital converter (TDC);
providing a TDC output indicative of a phase difference between the first clock signal and the first reference signal;
generating an enable signal based solely on a main reference signal; and
enabling and disabling the TDC based on the enable signal.

18. A method implemented in a wireless device, the method comprising:
receiving a first clock signal and a first reference signal at a time-to-digital converter (TDC);
providing a TDC output indicative of a phase difference between the first clock signal and the first reference signal;
generating an enable signal based on a main reference signal;
enabling and disabling the TDC based on the enable signal;

delaying the main reference signal to obtain a second reference signal; and generating the enable signal based on the main reference signal and the second reference signal.

19. An apparatus comprising:
time-to-digital converter (TDC) means for receiving a first clock signal and a first reference signal;
means for providing a TDC output indicative of a phase difference between the first clock signal and the first reference signal;
means for generating an enable signal based on a main reference signal and to enable and disable the TDC based on the enable signal;
RF accumulator means for receiving a main clock signal and count number of cycles of the main clock signal, wherein the RF accumulator means and the TDC means are part of a digital phase-locked loop (DPLL);
means for enabling the RF accumulator means when the DPLL is not locked; and
means for disabling the RF accumulator means after the DPLL has locked.

20. An integrated circuit comprising:
time-to-digital converter (TDC) means for receiving a first clock signal and a first reference signal;
means for providing a TDC output indicative of a phase difference between the first clock signal and the first reference signal;
means for generating an enable signal based on a main reference signal; and
means for enabling and disabling the TDC means based on the enable signal;
gating a main clock signal with the enable signal to obtain the first clock signal, the main clock signal being continuous, and the first clock signal having at least one clock cycle around each leading edge of the first reference signal and being gated off for remaining time.

21. A non-transitory computer readable storage medium comprising instructions that, when executed by a processor, perform a method comprising:
receiving a first clock signal and a first reference signal at a time-to-digital converter (TDC);
providing a TDC output indicative of a phase difference between the first clock signal and the first reference signal;
generating an enable signal based solely on a main reference signal; and
enabling and disabling the TDC based on the enable signal.

22. A non-transitory computer readable storage medium comprising instructions that, when executed by a processor, perform a method comprising:
receiving a first clock signal and a first reference signal at a time-to-digital converter (TDC);
providing a TDC output indicative of a phase difference between the first clock signal and the first reference signal;
generating an enable signal based on a main reference signal and to enable and disable the TDC based on the enable signal;
receiving a main clock signal and count number of cycles of the main clock signal at an RF accumulator, wherein the RF accumulator and the TDC are part of a digital phase-locked loop (DPLL);
enabling the RF accumulator when the DPLL is not locked; and
disabling the RF accumulator after the DPLL has locked.

* * * * *